United States Patent [19]
Mueller et al.

[11] Patent Number: 5,578,858
[45] Date of Patent: Nov. 26, 1996

[54] INFRARED RADIATION ABSORPTION DEVICE

[75] Inventors: Michael Mueller, Dresden; Ralf Gottfried-Gottfried, Wetzler; Heinz Kueck, Langebrueck, all of Germany

[73] Assignee: Fraunhofer-Gesellschaft zur Foerderung der angewandten Forschung e.V., Munich, Germany

[21] Appl. No.: 416,754

[22] PCT Filed: Oct. 7, 1993

[86] PCT No.: PCT/DE93/00954

§ 371 Date: Apr. 13, 1995

§ 102(e) Date: Apr. 13, 1995

[87] PCT Pub. No.: WO94/09517

PCT Pub. Date: Apr. 28, 1994

[30] Foreign Application Priority Data

Oct. 13, 1992 [DE] Germany .............. 42 34 471.9

[51] Int. Cl.$^6$ ................................. H01L 31/00
[52] U.S. Cl. .............. 252/432; 257/436; 257/443; 257/448; 257/466; 136/246; 136/256; 136/261; 250/338.1; 250/338.4
[58] Field of Search .................. 257/459, 466, 257/457, 443, 448, 436, 432; 136/261, 256, 246, 239, 249; 250/338.1, 338.4

[56] References Cited

U.S. PATENT DOCUMENTS

| | | |
|---|---|---|
| 3,110,816 | 11/1963 | Kaisler et al. ............. 250/338.1 |
| 4,158,133 | 1/1979 | Spaeth et al. ............. 250/211 J |
| 4,558,342 | 12/1985 | Sclar ........................... 357/30 |
| 4,608,451 | 8/1986 | Landis ....................... 136/256 |
| 4,620,364 | 11/1986 | Landis ........................ 29/572 |
| 5,100,478 | 3/1992 | Kawabata ................... 136/249 |
| 5,440,125 | 8/1995 | Hennins et al. ........... 250/338.1 |

FOREIGN PATENT DOCUMENTS

| | | |
|---|---|---|
| 0112646 | 7/1984 | European Pat. Off. . |
| 0253002 | 1/1988 | European Pat. Off. . |
| 0354672 | 2/1990 | European Pat. Off. . |
| 3446243 | 6/1986 | Germany . |
| 3827576 | 2/1990 | Germany . |
| 63-85320 | 4/1988 | Japan ......................... 250/338.1 |
| 2247985 | 3/1992 | United Kingdom ........... 257/443 |

OTHER PUBLICATIONS

Abtract of Japanese Publication No. 59–230123, vol. 9, No. 109 (P–355) (1832), May 14, 1995.
*1992 IEEE International Symposium on Circuits and Systems* entitled "Silicon Microsensors and Microstructures" by H. Baltes et al, vol. 4, May 10–13, 1992, pp. 1820–1823.
*Infrared Physics* entitled "Infrared and Millimeter Wave Absorber Structures for Thermal Detectors" by A. Hadni et al., vol. 30 (1990), pp. 465–478 no month.
Saha et al., *IEEE Transactions on Electron Devices* entitled "Influence of Surface Texturization on the Light Trapping and Spectral Response of Silicon Solar Cells", vol. 39, May 1992, No. 5, New York, pp. 1100–1107.

*Primary Examiner*—William Mintel
*Attorney, Agent, or Firm*—Evenson, McKeown, Edwards & Lenahan, P.L.L.C.

[57] ABSTRACT

The invention relates to an infrared radiation absorption device, which can be unrestrictedly produced from CMOS technology methods and materials. The absorber structure according to the invention comprises a lower layer (1) with a low transmission coefficient, a central layer (2) with a high absorption coefficient and an upper, absorbing component (3) with a low reflection coefficient for the radiation to be absorbed and which is applied from above. The upper component can e.g. comprise depressions in the central layer, whose walls are coated with metal. The absorber structure is used in the inexpensive manufacture of integrated, thermal infrared detectors.

18 Claims, 3 Drawing Sheets

INFRARED RADIATION ABSORPTION DEVICE

FIELD OF THE INVENTION

The invention relates to a device for the absorption of infrared radiation, which can be produced with CMOS technology materials and methods. Thermal infrared detectors based on thermopiles are manufactured and used to a significant extent as inexpensive detectors. The conversion of radiant energy of the infrared radiation into thermal energy takes place in so-called infrared absorbers.

BACKGROUND OF THE INVENTION

The most widely used infrared absorbers are black metal layers (e.g. Au, Ag, Pt), produced by deposition under a given foreign gas pressure. The very high and uniform infrared absorption is obtained through the porosity of the layers. The disadvantage of these absorber layers is their sensitivity to mechanical and chemical influences, so that the production of a clearly defined absorber geometry using CMOS technology processes is only possible by deposition via a resist mask, which leads to limitations in the technology. Another process for producing metal layers is electrodeposition. The problems of this process are inter alia ionic impurities of the electrolyte, the stressing of the disk-like support of the metal layers (e.g. silicon wafer) during electrolysis and that auxiliary planes are required for the electrodeposition of films. At present this is not a CMOS technology standard.

The literature refers to the possibility of infrared absorption by thin metal layers and $\lambda/4$ layers (e.g. A. Hadni and X. Gerbaux, Infrared and Millimeter Wave Absorber Structure for Thermal Detectors, Infrared Phys., vol. 30, No. 6, 1990, pp 465–478). By means of thin metal films it is possible to produce a uniform absorption for wavelengths above 1 μm, but which amounts to max 50%. The reflection losses on the absorber surfaces can be reduced with antireflection layers ($\lambda/4$ layers). However, the absorptivity of the thin metal layers is very dependent on the layer thickness, so that a precise layer thickness control is necessary for the production thereof.

Another group of infrared absorbers consists of organic layers such as hydrocarbon blacks and so-called black varnishes. At present, there are no CMOS-compatible technologies for the deposition and structuring of these layers.

H. Saha et al, Influence of Surface Texturization on the Light Trapping and Spectral Response of Silicon Solar Cells, IEEE Transactions on Electron Devices, vol. 39, No. 5, 1992, pp 1100–1106 describes an absorber structure, whose surface has pyramidal grooves or depressions formed by anisotropic etching in monocrystalline silicon. The disadvantage of this structure is that, firstly, a monocrystalline silicon layer must be applied for the production thereof, which is a process step requiring additional technological expenditure.

U.S. Pat. No. 4,620,364 discloses solar cells, which have a central monocrystalline layer (e.g. silicon crystal), as well as an upper and a lower, non-absorbing layer, both of which can be structured. By multiple reflection of the infrared radiation between the upper and lower layers, the optical path length of the radiation in the absorbing central layer is increased and, consequently, the solar cell efficiency is improved.

Such an arrangement cannot be appropriately applied to a support body (e.g. a membrane), as would be necessary for use as a thermal detector. As stated hereinbefore, increased technical expenditure is involved in the application of a monocrystalline layer, e.g. of silicon.

SUMMARY OF THE INVENTION

The problem of the present invention is consequently to provide a device for converting infrared radiation into thermal energy for thermal detectors, which has a large bandwidth and high absorption and which can be simply produced with known technologies.

According to the invention this problem is solved by the infra-red radiation absorption device, hereinafter called absorber structure, for converting infrared radiation into thermal energy for thermal detectors, comprising a support body; a lower layer applied on said support body; a central layer located on the lower layer; an upper component located on the central layer, said upper component facing incident infrared radiation; wherein said lower layer absorbs a portion of the incident radiation to be converted which is transmitted by the upper component and the central layer, said lower layer reflecting a remaining portion of said infrared radiation into the central layer; wherein said central layer has a high absorption coefficient for the radiation to be converted and wherein the upper component is used for absorbing both the radiation to be converted which is applied from above said upper component as well as stray radiation received from the lower layer; wherein said upper component reflects back into the control layer any stray radiation reflected by the lower layer which is not absorbed by said upper component; and further wherein said upper component has a low reflectivity for the infrared radiation to be converted which is applied from above said upper layer. The device according to the invention comprises three basic components. The lower component is a layer with a low transmission coefficient for the infrared radiation to be absorbed. It absorbs part of the incident radiation and reflects the unabsorbed part back into the components positioned above it. The central component is formed by a layer with a high absorption coefficient and a low reflection coefficient for the radiation to be absorbed. It mainly brings about absorption and serves as a spacer between the upper and lower components. The upper component is used for the absorption of the radiation striking the device from above and the stray radiation from the lower components and reflects the unabsorbed radiation from the lower absorber components back into the absorber structure. The upper component must be designed in such a way that the radiation striking said component from above is reflected to the minimum extent. Preferred developments of the upper component are further described herein. By multiple reflections of the incident infrared radiation between the individual components of the device according to the invention its total absorptivity is advantageously increased. The device according to the invention has absorption over a wide wavelength range.

The device according to the invention can be produced with CMOS technology materials and methods without restriction. As an example of this reference is made to the embodiment. Thus, the production process can, in advantageous manner and without additional costs, be integrated into a CMOS cycle. The continuous, inexpensive production of thermal infrared detectors in CMOS technology, e.g. on the basis of thermopiles is consequently rendered possible.

According to a further development of the device according to the invention the upper component comprises depressions prepared in the central layer and whose walls are coated with metal. These depressions can e.g. be arranged in matrix-like manner. In this construction the upper component acts on the incident radiation like an array of cavities. Multiple reflection of the radiation into the cavities increases absorption, so that the absorptivity of the individual cavity is above that of the wall material used (metal layer).

A further embodiment of the upper component of the device according to the invention is also described herein. Thus, the upper component is formed by an aluminum layer applied to the central layer and which has through depressions (through openings), whose depth is only limited by the underlying, central layer. The depressions can e.g. be arranged in matrix or honeycomb manner. On the aluminum layer is deposited a thin oxide protective film, which does not change the surface structure of the upper component.

A preferred development of the device according to the invention is obtained by the exclusive use of CMOS technology materials and methods. Thus, as described hereinbefore, integrated, thermal infrared detectors can be inexpensively manufactured.

In an advantageous development of the device according to the invention, the lower layer is constituted by a 1 μm thick aluminum layer. The central layer is an oxide layer with a thickness between 2 and 8 μm. The upper component is formed by a matrix of depressions in the central layer, whose walls (i.e. also the bottom) are covered with a 500 nm thick aluminum layer. The edges of the depressions have rectangular cross-sections with an edge length of 2 to 4 μm and are arranged in matrix-like manner with a reciprocal spacing of 2 to 10 μm.

An advantageous embodiment of the device according to the invention, is provided in which the depressions in the central layer are filled with a planarization oxide (e.g. SiO$_2$). When using the production variant of the means according to the invention described in the first embodiment, this embodiment is technologically caused. The presence of the planarization oxide in the depressions advantageously leads to additional damping and therefore to an increase in the absorption of the incident radiation.

The invention is described hereinafter relative to two embodiments and the attached drawings, wherein show:

BRIEF DESCRIPTION OF THE DRAWINGS

FIG. 5b A plan view of the upper component of the absorber structure of FIG. 5a.

DETAILED DESCRIPTION OF THE DRAWINGS

Figure 1:
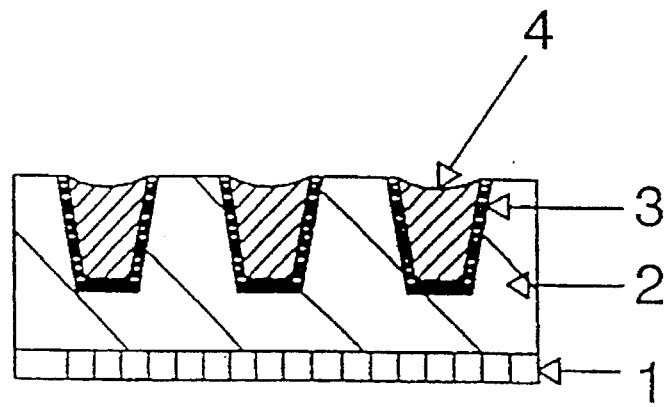
FIG. 1 A cross-section through the absorber structure of an embodiment.
Figure 2:
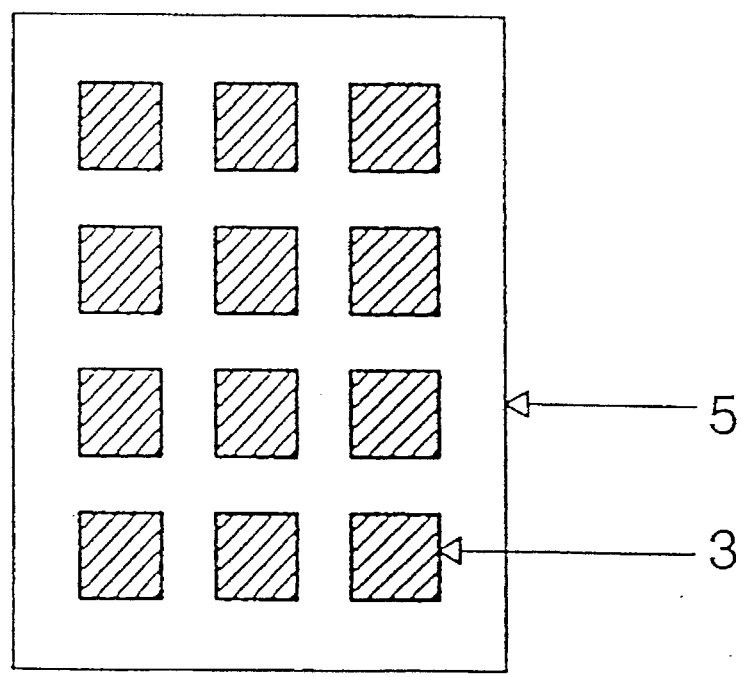
FIG. 2 A plan view of the absorber structure of FIG. 1.

An embodiment for the infrared radiation absorption device according to the invention is shown in cross-section in FIG. 1. The lower component is here formed by a 1 μm thick aluminum layer 1. The central layer 2 is an oxide or nitride layer with a thickness between 2 and 8 μm. The upper component 3 comprises depressions (with a depth in the μm range), whose walls are covered with a 500 nm thick aluminum layer. The edges of the depressions have rectangular cross-sections, as is shown in plan view in FIG. 2, with an edge length of 2 to 4 μm and are arranged in a matrix-like manner with a reciprocal spacing of 4.8 to 8.8 μm. In the depressions, there is a planarization oxide 4, which is for technological reasons. FIG. 2 also shows the edge 5 of the lower aluminum layer.

The technology for producing the absorber structure of this embodiment will now briefly be explained. Onto a silicon wafer is sputtered the 1 μm thick aluminum layer and on it is deposited by a CVD process the 2 to 8 μm thick oxide layer (SiO$_2$). By a plasma etching process depressions are etched by means of a resist mask, which corresponds to contact window technology. Following residual varnish removal, a 500 nm thick aluminum film is sputtered onto the structure. This is followed by the deposition of a planarization oxide (e.g. SiO$_2$), which is etched back plasma-chemically, so that the planarization oxide is only present in the depressions. The planarization oxide covers the aluminum layer in the depressions, whereas it is exposed between the depressions. In this way the planarization oxide forms the etching mask for the subsequent aluminum etching process, after the performance of which the aluminum of the upper component is only present on the walls of the depressions.

Figure 3:
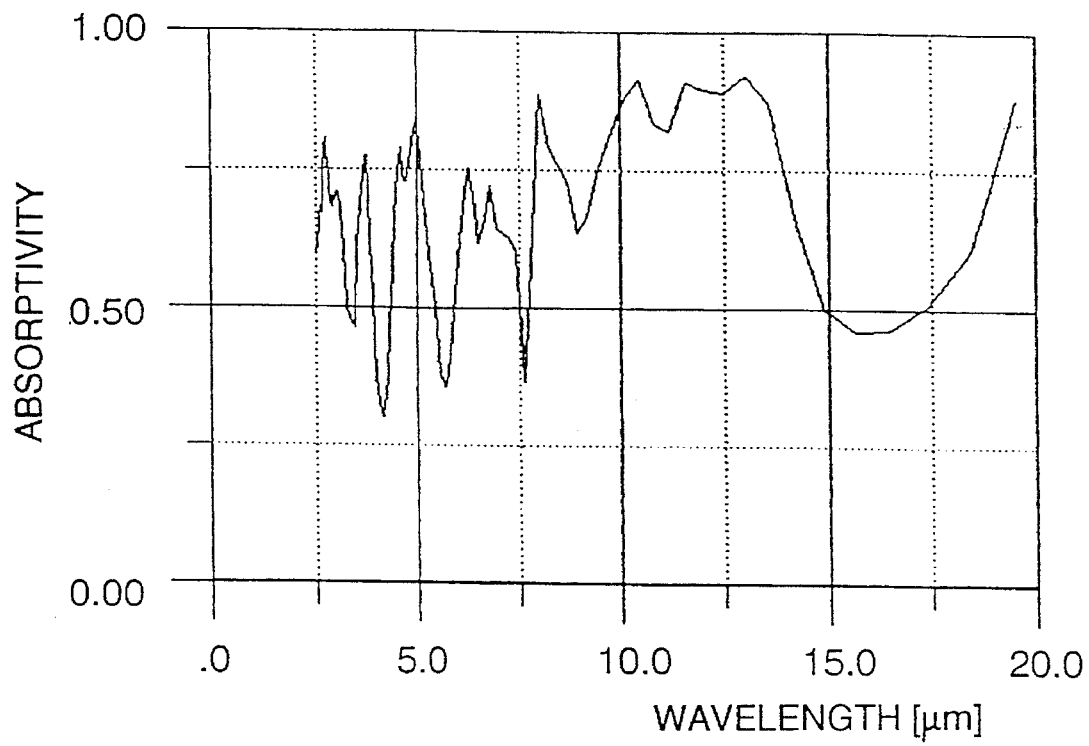
FIG. 3 A measured absorption spectrum of the absorber structure of the embodiment.

An absorption spectrum of the absorber structure of the embodiment is shown in FIG. 3, where the absorptivity of the absorber structure is plotted as a function of the wavelength of the incident radiation, It can be seen that the production of an infrared absorber with a wide absorption bandwidth is possible with the absorber structure according to the invention without any CMOS technology restrictions.

Figure 4:
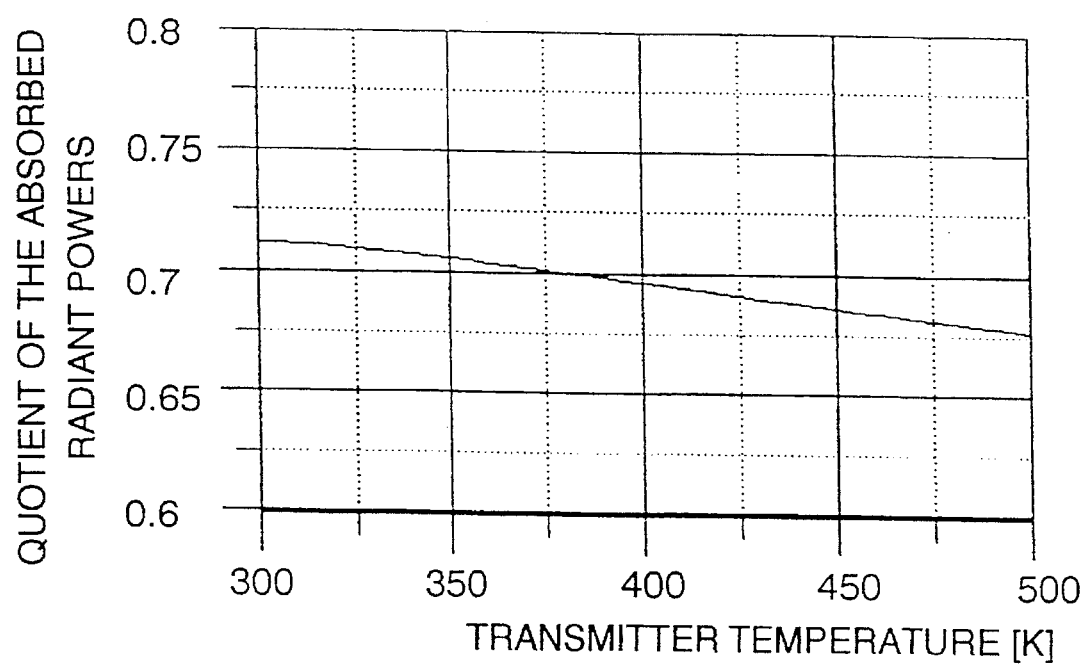
FIG. 4 The relationship of the radiant power absorbed by the absorber structure of the embodiment to the radiant power absorbed by a black body.
Figure 5A:
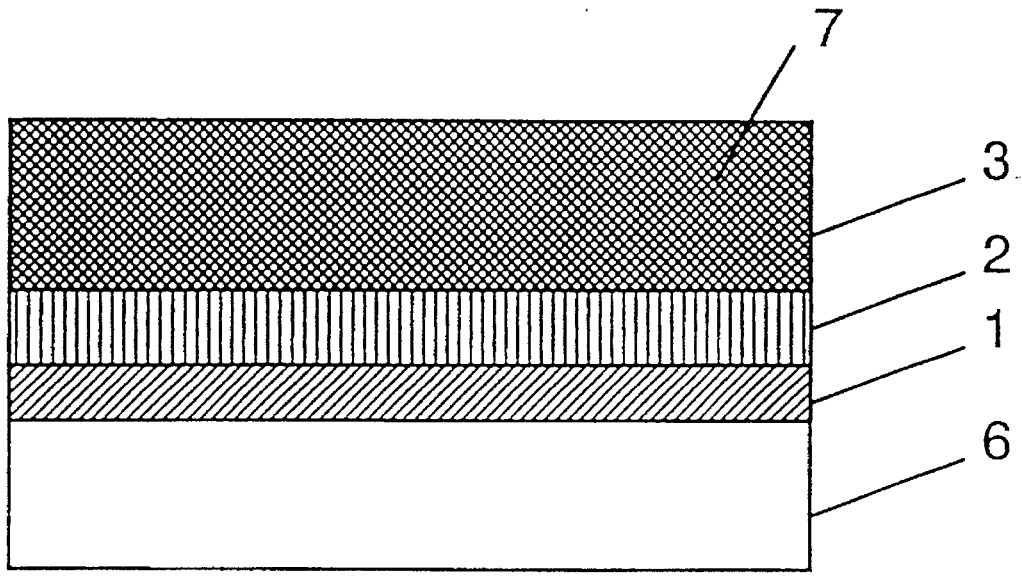
FIG. 5a A cross-section through the absorber structure of another embodiment.
Figure 5:
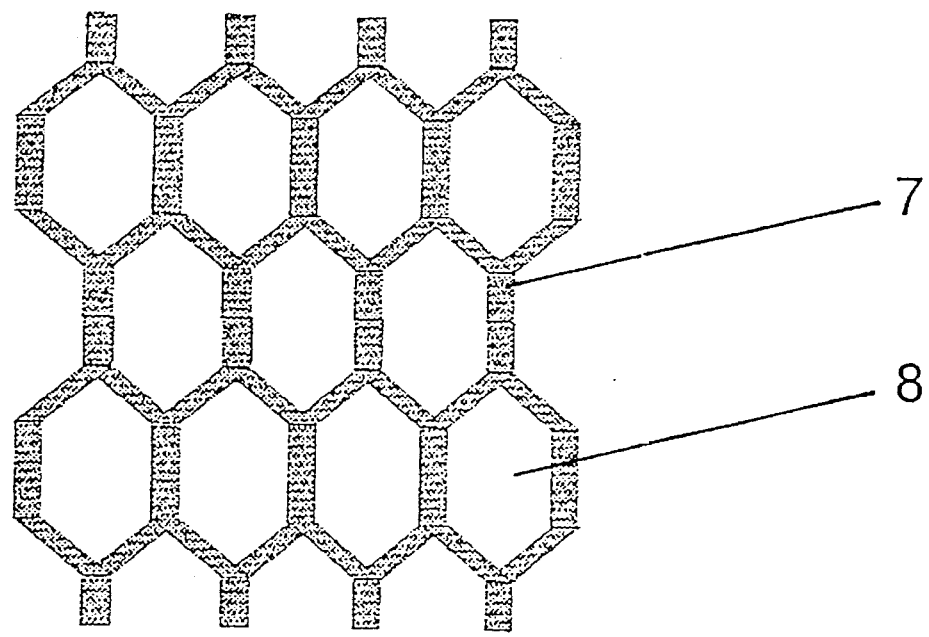

FIG. 4 shows the relationship of the infrared radiant power absorbed by the absorber structure of the embodiment to the radiant power absorbed by a black body as a function of the temperature of a transmitter with the emission coefficient=1. The efficiency of the absorber structure according to the invention is consequently largely independent of the transmitter temperature, FIG. 5a diagrammatically shows another embodiment of the structure according to the invention, The different layers of the absorber structure are applied to a silicon membrane 6 as the support body. The lower layer 1 is an aluminum layer with a thickness of approximately 500 nm, the middle layer 2 a SiO$_2$ layer with a thickness of approximately 750 nm and which has been applied in the manner described in the first embodiment to the silicon membrane 6. The upper component 3 comprises an approximately 2 μm thick aluminum layer 7 and a superimposed SiO$_2$ protective film (not shown in FIG. 5a) having a thickness of approximately 750 nm. The aluminum layer has a honeycomb structure with through depressions 8 (holes) (not shown in FIG. 5a). The honeycomb structure of the aluminum layer 7 is shown in FIG. 5b with the through depressions 8. The application of the aluminum layer of the upper component to the middle layer takes place by sputtering. For producing the honeycomb structure, the layer is masked in a conventional manner and RIE-structured. The SiO$_2$ protective film is deposited by CVD.

What is claimed is:

1. A device for converting infrared radiation into thermal energy for thermal detectors, comprising:

a support body;

a lower layer applied on said support body;

a central layer located on the lower layer;

an upper component located on the central layer, said upper component facing incident infrared radiation;

wherein said lower layer absorbs a portion of the incident radiation to be converted which is transmitted by the upper component and the central layer, said lower layer reflecting a remaining portion of said infrared radiation into the central layer;

wherein said central layer absorbs radiation coming from the upper component and the reflected radiation coming from the lower layer;

wherein said upper component is used for absorption of incoming radiation from an exterior of the device, for absorption of radiation reflected by the lower and the central layers, and for reflection of radiation reflected by the lower and the central layers back in the central layer;

wherein said upper component reflects back into the central layer any stray radiation reflected by the lower layer which is not absorbed by said upper component; and further wherein said upper component has a lower reflectivity for the infrared radiation to be converted which is applied from an exterior to said upper component than for radiation applied from an interior of said device.

2. Device according to claim 1, wherein the central layer has depressions having walls, and wherein the upper component is formed by a metal coating formed on the walls of said depressions.

3. Device according to claim 1, wherein the upper component comprises an aluminum layer with through depressions and a oxide protective film deposited thereon.

4. Device according to claim 1, wherein the lower layer, the central layer and the upper component are made from CMOS technology materials.

5. Device according to claim 2, wherein the lower layer, the central layer and the upper component are made from CMOS technology materials.

6. Device according to claim 3, wherein the lower layer, the central layer and the upper component are made from CMOS technology materials.

7. Device according to claim 1, wherein the lower layer comprises an aluminum layer, the central layer an oxide layer and the upper component a matrix of depressions in the central layer, whose walls are covered with an aluminum layer, edges of the depressions having rectangular cross-sections with an edge length of 2 to 4 µm and having a reciprocal spacing of 2 to 10 µm.

8. Device according to claim 2, wherein the lower layer comprises an aluminum layer, the central layer an oxide layer and the upper component a matrix of depressions in the central layer, whose walls are covered with an aluminum layer, edges of the depressions having rectangular cross-sections with an edge length of 2 to 4 µm and having a reciprocal spacing of 2 to 10 µm.

9. Device according to claim 4, wherein the lower layer comprises an aluminum layer, the central layer an oxide layer and the upper component a matrix of depressions in the central layer, whose walls are covered with an aluminum layer, edges of the depressions having rectangular cross-sections with an edge length of 2 to 4 µm and having a reciprocal spacing of 2 to 10 µm.

10. Device according to claim 2, wherein the depressions of the upper component are filled with a planarization oxide.

11. Device according to claim 2, wherein the depressions of the upper component are filled with a planarization oxide.

12. Device according to claim 7, wherein the depressions of the upper component are filled with a planarization oxide.

13. Device according to claim 3, wherein the depressions of the upper component are filled with a planarization oxide.

14. Device according to claim 7, wherein the lower layer comprises a 1 µm thick aluminum layer, the central layer a 2 to 8 µm thick oxide layer and the upper component a matrix of depressions in the central layer, whose walls are covered with a 500 nm thick aluminum layer, edges of the depressions having rectangular cross-sections with an edge length of 2 to 4 µm and having a reciprocal spacing of 2 to 10 µm.

15. Device according to claim 8, wherein the lower layer comprises a 1 µm thick aluminum layer, the central layer a 2 to 8 µm thick oxide layer and the upper component a matrix of depressions in the central layer, whose walls are covered with a 500 nm thick aluminum layer, edges of the depressions having rectangular cross-sections with an edge length of 2 to 4 µm and having a reciprocal spacing of 2 to 10 µm.

16. Device according to claim 9, wherein the lower layer comprises a 1 µm thick aluminum layer, the central layer a 2 to 8 µm thick oxide layer and the upper component a matrix of depressions in the central layer, whose walls are covered with a 500 nm thick aluminum layer, edges of the depressions having rectangular cross-sections with an edge length of 2 to 4 µm and having a reciprocal spacing of 2 to 10 µm.

17. A device for converting infrared radiation into thermal energy for thermal detectors, comprising:

a support body;

a lower layer applied on said support body;

a central layer located on the lower layer;

an upper component having a patterned metal surface located on the central layer, said upper component facing incident infrared radiation;

wherein said lower layer absorbs a portion of the incident radiation to be converted which is transmitted by the upper component and the central layer, said lower layer reflecting a remaining portion of said infrared radiation into the central layer;

wherein said central layer absorbs radiation coming from the upper component and the reflected radiation coming from the lower layer;

wherein said patterned metal surface of said upper component is used for absorption of incoming radiation from an exterior of the device, for absorption of radiation reflected by the lower and the central layers, and for reflection of radiation reflected by the lower and the central layers back in the central layer; and wherein said upper component reflects back into the central layer any stray radiation reflected by the lower layer which is not absorbed by said upper component.

18. A device for converting infrared radiation into thermal energy for thermal detectors, comprising:

a support body;

a lower layer applied on said support body;

a central layer located on the lower layer;

an upper component having a patterned metal surface located on the central layer, said upper component facing incident infrared radiation;

wherein said lower layer absorbs a portion of the incident radiation to be converted which is transmitted by the upper component and the central layer, said lower layer reflecting a remaining portion of said infrared radiation into the central layer;

wherein said central layer absorbs radiation coming from the upper component and the reflected radiation coming from the lower layer;

wherein said patterned metal surface of said upper component is used for absorption of incoming radiation from an exterior of the device, for absorption of radiation reflected by the lower and the central layers, and for reflection of radiation reflected by the lower and the central layers back in the central layer;

wherein said upper component reflects back into the central layer any stray radiation reflected by the lower layer which is not absorbed by said upper component; and further wherein said upper component has a lower reflectivity for the infrared radiation to be converted which is applied from an exterior to said upper component than for radiation applied from an interior of said device.

* * * * *